United States Patent [19]
Rolfson

[11] Patent Number: 5,672,450
[45] Date of Patent: Sep. 30, 1997

[54] METHOD OF PHASE SHIFT MASK FABRICATION COMPRISING A TAPERED EDGE AND PHASE CONFLICT RESOLUTION

[75] Inventor: J. Brett Rolfson, Boise, Id.

[73] Assignee: Micron Technology, Inc., Boise, Id.

[21] Appl. No.: 589,942

[22] Filed: Jan. 23, 1996

Related U.S. Application Data

[63] Continuation-in-part of Ser. No. 240,994, May 11, 1994, Pat. No. 5,487,962.

[51] Int. Cl.⁶ ............................................. G03F 9/00
[52] U.S. Cl. ................................... 430/5; 430/322
[58] Field of Search ...................... 430/5, 322; 364/491

[56] References Cited

U.S. PATENT DOCUMENTS

| | | | |
|---|---|---|---|
| 5,281,500 | 1/1994 | Cathey et al. | 430/5 |
| 5,288,568 | 2/1994 | Cathey et al. | 430/5 |
| 5,308,722 | 5/1994 | Nistler | 430/5 |
| 5,468,578 | 11/1995 | Rolfson | 430/5 |

FOREIGN PATENT DOCUMENTS 4-254855  10/1992  Japan .

OTHER PUBLICATIONS

Investigating Phase–Shifting Mask Layout Issues Using a Cad Toolkit, Wong, Alexander S. et al., IEDM Meeting, Washington, D.C., pp. 705–708 Dec. 1991.

*Primary Examiner*—S. Rosasco
*Attorney, Agent, or Firm*—Stephen A. Gratton

[57] ABSTRACT

A method for forming a phase shifting photomask is provided. The method includes forming a transparent substrate having a pattern of opaque features and determining areas of phase conflicts between the features. Phase shifters having a tapered edge are formed on selected portions of the features in the phase conflict areas while the remaining portion of the features remain unprotected. During a subsequent lithographic process using the photomask, the tapered edges of the phase shifters spread out the electric field so that an image corresponding to the tapered edges does not print at the target. This permits the phase shifters to be located without the constraints of an alternating aperture pattern. The phase shifters can be formed using an additive process in which a phase shift layer is deposited over the opaque features or using a subtractive process in which the substrate subjacent to the opaque features is etched.

27 Claims, 5 Drawing Sheets

METHOD OF PHASE SHIFT MASK FABRICATION COMPRISING A TAPERED EDGE AND PHASE CONFLICT RESOLUTION

CROSS-REFERENCE TO RELATED APPLICATIONS

This application is a continuation-in-part of U.S. patent application Ser. No. 08/240,994 filed on May 11, 1994, U.S. Pat. No. 5,487,962.

FIELD OF THE INVENTION

This invention relates to optical lithography and more particularly to the fabrication of photomasks or reticles which are used in optical lithography. The method of the invention is particularly suited to the fabrication of phase shifting photomasks for semiconductor manufacture.

BACKGROUND OF THE INVENTION

In semiconductor manufacture, micro lithography is used in the formation of integrated circuits on a semiconductor wafer. During a lithographic process, a form of radiant energy such as ultraviolet light, is passed through a photomask or reticle and onto the semiconductor wafer. The photomask contains opaque and transparent regions formed in a predetermined pattern. A grating pattern, for example, can be used to define parallel spaced conducting lines on a semiconductor wafer. The ultraviolet light exposes the mask pattern on a layer of resist formed on the wafer. The resist is then developed for removing either the exposed portions of resist for a positive resist or the unexposed portions of resist for a negative resist. The patterned resist can then be used during a subsequent semiconductor fabrication process such as ion implantation or etching.

As microcircuit densities have increased, the size of the features of semiconductor devices have decreased to the sub micron level. These sub micron features may include the width and spacing of metal conducting lines or the size of various geometric features of active semiconductor devices. The requirement of sub micron features in semiconductor manufacture has necessitated the development of improved lithographic processes and systems. One such improved lithographic process is known as phase shift lithography.

With phase shift lithography, the interference of light rays is used to overcome diffraction and improve the resolution and depth of optical images projected onto a target. In phase shift lithography, the phase of an exposure light at the object is controlled such that adjacent bright areas are formed preferably 180 degrees out of phase with one another. Dark regions are thus produced between the bright areas by destructive interference even when diffraction would otherwise cause these areas to be lit. This technique improves total resolution at the object and allows resolutions as fine as 0.18 μm to occur.

In general, a phase shifting photomask is constructed with a repetitive pattern formed of three distinct layers or areas. An opaque layer provides areas that allow no light transmission. A transparent layer provides areas which allow close to 100% of light to pass through. A phase shift layer provides areas which allow close to 100% of light to pass through but phase shifted 180 degrees from the light passing through the transparent areas. The transparent areas and phase shift areas are situated such that light rays diffracted through each area are canceled out in a darkened area therebetween. This creates the pattern of dark and bright areas which can be used to clearly delineate features of a pattern defined by the opaque layer of the mask on a photopatterned semiconductor wafer.

Recently, different techniques have been developed in the art for fabricating different types of phase shifting photomasks. One type of phase shifting mask, named after a pioneer researcher in the field, M. D. Levenson, is known in the art as a "Levenson" phase shifting mask. This type of mask is also referred to as an "alternating aperture" phase shifting mask because opaque light blockers alternate with light transmission apertures and every other aperture contains a phase shifter.

This type of mask is typically formed on a transparent quartz substrate. An opaque layer, formed of a material such as chromium, is deposited on the quartz substrate and etched with openings in a desired pattern. Phase shifting areas on the mask are formed by depositing a phase shifting material over the opaque layer and into every other opening in the opaque layer. This is termed an "additive" phase shifting mask. Alternately, phase shifting areas of the mask may be formed in areas of the quartz substrate having a decreased thickness. This is termed a "subtractive" phase shifting mask.

Figure 1A:
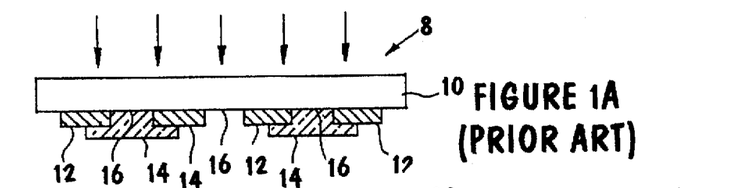
FIG. 1A is a cross sectional view of a prior art phase shifting photomask constructed with an additive process.
Figure 1B:
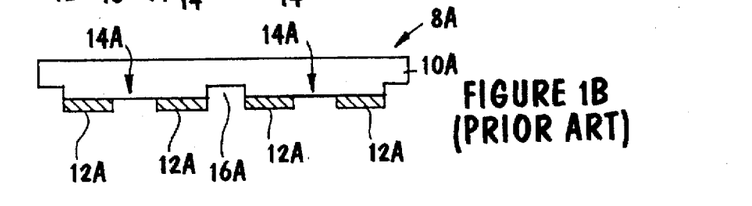
FIG. 1B is a cross sectional view of a prior art phase shifting photomask constructed with a subtractive process.

Two types of alternating aperture phase shifting photomasks are shown in FIGS. 1A and 1B. FIG. 1A shows an additive phase shifting mask 8 comprising a transparent substrate 10 and opaque light blockers 12 with light transmission openings 16 therebetween. The phase shifters 14 for the phase shifting mask 8 are formed as segments of a light transmissive material, such as $SiO_2$, deposited in every other light transmissive opening 16.

FIG. 1B shows a subtractive phase shifting mask 8A. In a subtractive phase shifting mask 8A, the phase shifters 14A are formed by etching the substrate 10A aligned with every other light transmission opening 16A in the opaque layer 12A. In the subtractive phase shifting mask 8A, the unetched portions of the substrate 10A form the phase shifters 14A. Although the additive and subtractive phase shifting masks are fabricated by different methods, the operation of these photomasks is equivalent.

Figure 2A:
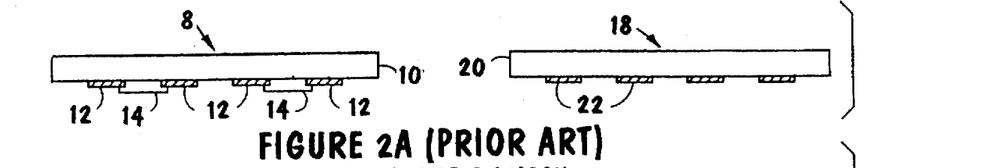
FIGS. 2A–2D are combined cross sectional views of prior art conventional and phase shifting photomasks, with accompanying plots showing the electric field and intensity on the mask and wafer during a photopatterning process.
Figure 2B:
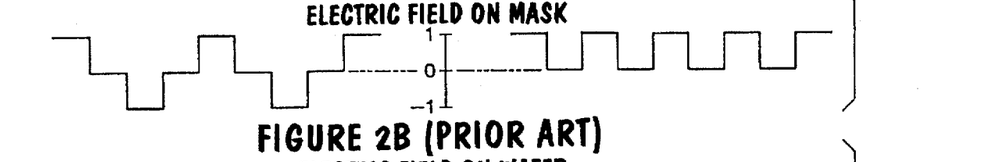
Figure 2C:
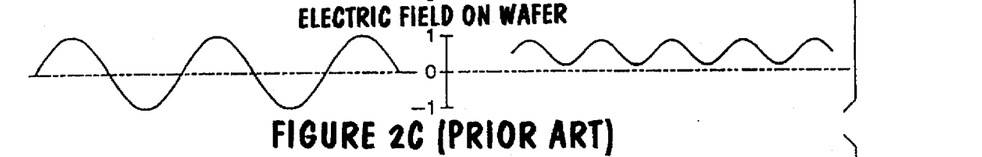
Figure 2D:
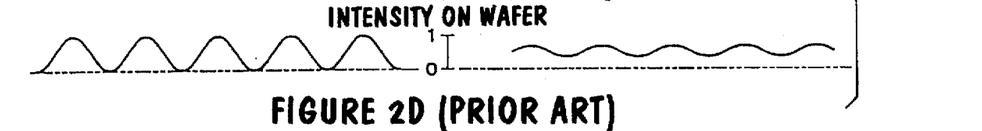

The operation of the phase shifting mask 8 contrasted with the operation of a conventional photomask 18 formed with a transparent substrate 20 and opaque light blockers 22, is shown in FIGS. 2A–2D. FIG. 2B shows the electric field on the mask 8. FIG. 2C shows the electric field on the wafer. FIG. 2D shows the intensity on the wafer.

As shown in FIG. 2B, the phase shifters 14 create a "−1" amplitude on the wafer. This effectively reduces the spatial frequency of the electric field so that it is less inhibited by the lens transfer function of the imaging system and forms a higher contrast amplitude image at the wafer plane. When the electric field is recorded by the photoresist, only the intensity that is proportional to the square of the electric field amplitude is recorded. This doubles the reduced spatial frequency and produces an image of much higher contrast. In addition to the reduction of spatial frequency, the electric field is forced to pass through zero to −1. Thus edge contrast is improved. Therefore, the alternating phase shifting system benefits from the reduction of spatial frequencies as well as the enhancement of edge contrast.

One problem with alternating aperture phase shifting photomasks occurs with complex patterns having non-regular geometrical features. These non-regular geometrical features create phase conflict areas in which closely spaced geometries have the same phase. These phase conflict areas are difficult to accommodate with an alternating aperture pattern in which a phase shifter must be formed between every other feature. In addition, auto-generated layout techniques for forming alternating aperture phase shifting masks, such as auto-CAD, utilize standard layout rules which cannot be easily reconciled if complex or non-regular patterns are required.

Figure 3:
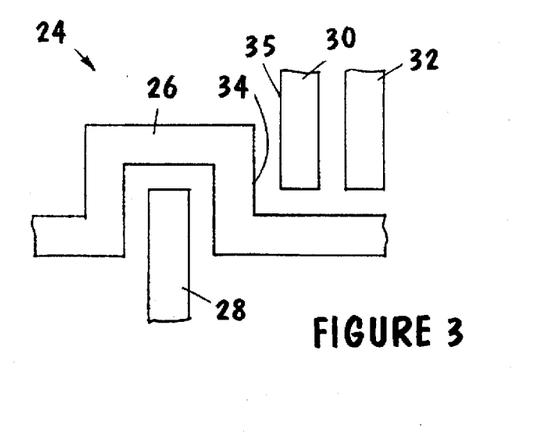
FIG. 3 is a plan view of a prior art mask pattern.

This situation is illustrated in FIG. 3. In FIG. 3 a mask pattern 24 includes a non-linear feature 26 that jogs around a first linear feature 28 and extends past the ends of linear features 30 and 32. In this mask pattern 24, the non-linear feature 26 creates phase conflict areas. In general, a phase conflict occurs where two areas of the same phase occur together on the mask pattern in very close proximity. For example, in the mask pattern 24 shown in FIG. 3, an edge 34 of non-linear feature 26 has a same phase as edge 35 of linear feature 30. If the design requirements are such that these edges are in very close proximity, a phase conflict area is formed. These types of phase conflict areas make auto-CAD pattern generation of an alternating aperture mask difficult because they cannot be accommodated by simple design rules.

Because of these and other problems, there is a need in the art for improved methods for forming phase shifting photomasks, particularly for complex mask patterns having non-regular geometrical features.

Accordingly, it is an object of the present invention to provide an improved method for forming phase shifting photomasks.

It is another object of the present invention to provide an improved method for forming phase shifting photomasks that can be used to form random geometrical features and that allows a width of a feature to be adjusted.

It is a further object of the present invention to provide an improved method for forming phase shifting photomasks that is compatible with auto-CAD layout techniques used for designing phase-shifting photomasks.

Other objects, advantages and capabilities of the present invention will become more apparent as the description proceeds.

SUMMARY OF THE INVENTION

In accordance with the present invention, an improved method for forming phase shifting photomasks is provided. The method of the invention generally stated comprises: determining a mask pattern; forming an opaque layer on a transparent substrate; patterning the opaque layer to define geometrical features for the mask pattern; determining areas of phase conflict between the features; and then placing a phase shifter with a tapered edge on a selected portion of at least one feature in a phase conflict area.

Each phase shifter includes a tapered edge formed at an angle shallow enough such that in a subsequent lithographic process, the point spread function of the lithographic system does not allow an image of the phase shifter edge to print at the target. For a typical lithographic process, the slope of the phase shifter edge is set an angle with respect to the surface of the substrate, that is less than forty-five degrees. This phase shifter construction permits the phase shifters to be placed on different portions of opaque features as required, rather than in an alternating pattern to satisfy phase conflicts between adjacent features. For example, a feature defined by an opaque rectangle can include an unprotected edge and an edge having an associated phase shifter. This permits phase shifted (e.g., 180°) exposure energy to pass along one side of the feature and 0° exposure energy to pass along the other side. In addition, a width of the printed feature at the target corresponds to the width of the opaque feature on the photomask.

The phase shifter can be formed using an additive process or using a subtractive process. With an additive process the phase shifter is superjacent to the opaque feature. With a subtractive process the phase shifter is subjacent to the opaque feature. In either case, the tapered edge of the phase shifter is formed using a photomask and an etch process.

The method of the invention can be implemented using a computer assisted design (CAD) program having a design rule set. Initially shrink parameters are determined from an imaging analysis of the geometrical features of the mask pattern and a shrink factor is ascertained. The mask pattern is reduced using the shrink factor. Areas of phase conflict are identified using a design rule check that incorporates minimum line width and spacing rules. Phase shifters can then be placed in phase shift areas using design rules. For example, design graphs that show contrast as a function of feature separation can be used to determine design rules for specific features.

DETAILED DESCRIPTION OF THE PREFERRED EMBODIMENTS

As used herein, the terms "mask" and "photomask" are interchangeable and refer to an element that can be used directly to project a pattern onto a target during a photolithographic process or to form a "working mask" by printing or other techniques.

Figure 4:
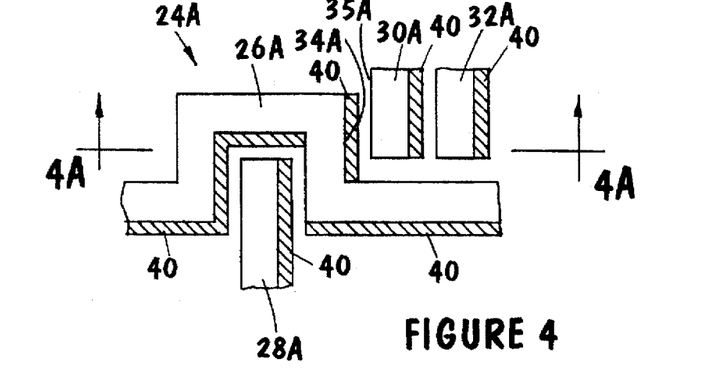
FIG. 4 is a plan view of the mask pattern shown in FIG. 3 but constructed with phase shifters formed in accordance with the invention.
Figure 4A:
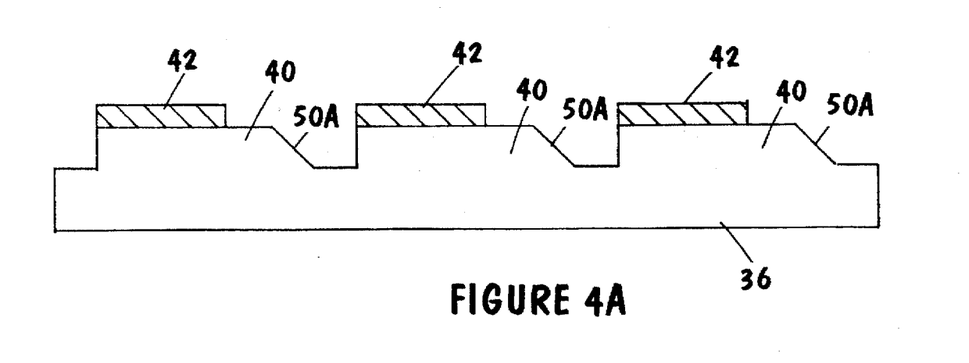
FIG. 4A is a schematic cross sectional view taken along section line 4A—4A of FIG. 4.

Referring now to FIGS. 4 and 4A, a mask pattern 24A formed in accordance with the invention is shown. The mask pattern 24A includes opaque features 26A, 28A, 30A, 32A formed on a transparent substrate 36 (FIG. 4A). The mask pattern 24A is equivalent to the mask pattern 24 (FIG. 3) previously described and includes the non-linear feature 26A that jogs around a linear feature 28A. The mask pattern 24A also includes phase shifters 40 formed on select portions 42 (FIG. 4A) of the opaque features 26A, 28A, 30A, 32A. The phase shifters 40 include a tapered edge 50A (FIG. 4A) that will not print at the target.

Figure 5A:
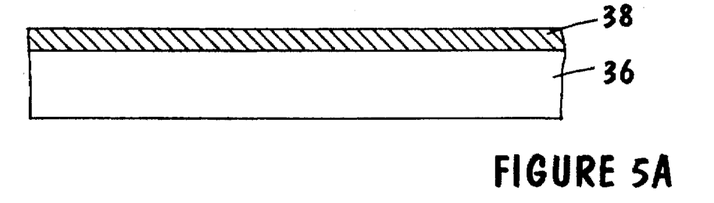
FIGS. 5A–5F are schematic cross sectional views illustrating steps in forming a phase shift photomask in accordance with the invention using a subtractive process.

Referring to FIGS. 5A–5E, manufacturing steps in forming the opaque features 26A, 28A, 30A, 32A (FIG. 4) and phase shifters 40 (FIG. 4A) for the mask pattern 24A (FIG. 4) are illustrated. Initially as shown in FIG. 5A, an opaque layer 38 is blanket conformally deposited on the substrate 36 (e.g., sputtering, CVD), patterned using a mask and then etched. The substrate 36 is formed of a material that is transparent to light at an exposure wavelength (e.g., 365 nm). A typical material known in the art is quartz (fused silica). The opaque layer 38 can be formed of a material such as chromium; chrome; mixtures of chromium, oxygen and nitrogen; and mixtures of molybdenum, silicon, oxygen and nitrogen. Standard mask blanks comprising a quartz substrate with a blanket deposited opaque layer are commercially available from DuPont photoblanks division of Poughkeepsie, NY.

Figure 5B:
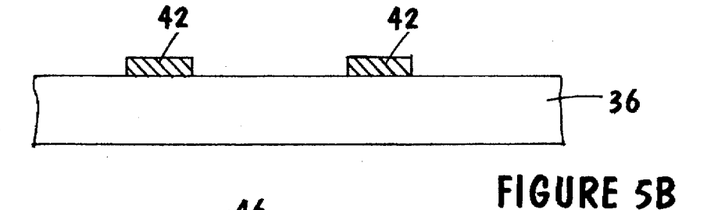

Next as shown in FIG. 5B, the opaque layer 38 is patterned and etched to form the opaque features 26A, 28A, 30A, 32A (FIG. 4). In FIG. 5B, select portions 42 of the opaque features 26A, 28A, 30A, 32A on which phase shifters 40 (FIG. 4) are to be formed are shown. The opaque layer 38 (FIG. 5A) is patterned by depositing a layer of resist (not shown) and then exposing and developing the resist in the desired pattern. A preferred method of patterning the opaque is layer 38 (FIG. 5A) is with an electron beam maskwriter. A suitable E-beam mask writer is manufactured by Cambridge and is designated an EBMF 10.5 e-beam system. Another suitable e-beam system is a MEBES™ 4500 mask writer sold by ETEC Systems, Inc., 26460 Corporate Ave., Hayward, Calif. 94545.

Figures 5C, 5D:
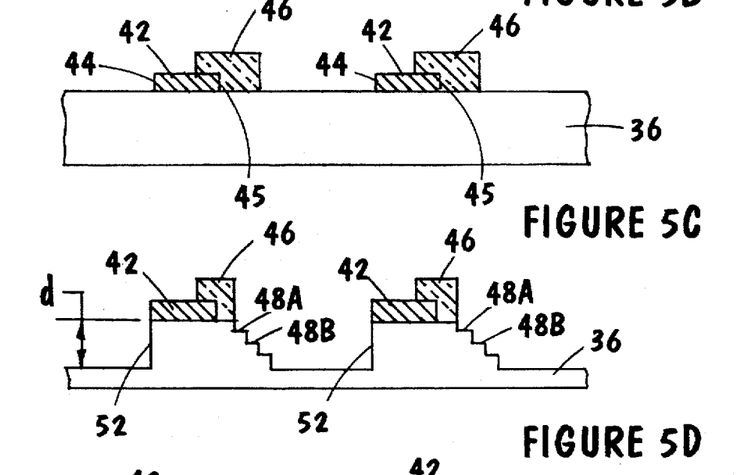

Next, as shown in FIG. 5C, a layer of photoresist 46 is deposited on the substrate 36 and then patterned to cover only a portion of the select portions 42 of the opaque features 26A, 28A, 30A, 32A (FIG. 4). In other words, the layer of photoresist 46 is exposed and developed such that one sidewall 44 of each select portion 42 of the opaque features 26A, 28A, 30A, 32A (FIG. 4) is exposed but the other sidewall 45 is covered by the layer of photoresist 46. One suitable mask writer for patterning (i.e., writing) the layer of photoresist is an ALTA-3000 also manufactured by ETEC Systems, Inc.

Next, as shown in FIG. 5D, the substrate 36 is isotropically etched using a fluorine based etching species such as $SF_6$, $CF_4$ or $CHF_3$ and the photoresist 46 is isotropically etched using an $O_2$ or $O_2/N_2$ etching species. A sequential etch process (i.e., etch substrate 36 then photoresist 46) forms a small stair step 48A. Following formation of the stair step 48A, another stair step 48B is formed using the same sequential process. This process is repeated several times to create a succession of stair steps to form a tapered edge 50 that resembles a stairstep.

The slope of the tapered edge 50 is set at an angle shallow enough such that in a subsequent lithographic process using a photomask constructed in accordance with the invention, the point spread function of the imaging system does not print an image on the wafer. For a typical imaging system and photolithography process, the slope is set at an angle less than forty-five degrees.

Alternately in place of isotropically etching the photoresist 46 and the substrate 36 separately in sequence, these etch steps can be performed simultaneously by combining the etching species. In this case, the oxygen containing species attacks primarily the photoresist 46 and the fluorine containing species attacks primarily the substrate 36. This would produce a smooth tapered edge 50A as indicated in FIG. 5F. A desired slope for the smooth tapered edge 50A can be achieved by controlling the ratio of the etching species during the etching step. Again, for a typical photolithographic system, the angle of the slope is less than 45°.

At the same time that the tapered edges 50 or 50A) are formed by sequentially or simultaneously etching the photoresist 46 and the quartz substrate 35, vertical edges 52 (FIG. 5D) are formed in the substrate 36 adjacent to the exposed sidewalls 44 (FIG. 5C) of the select portions 42 of the opaque features.

Figure 5E:
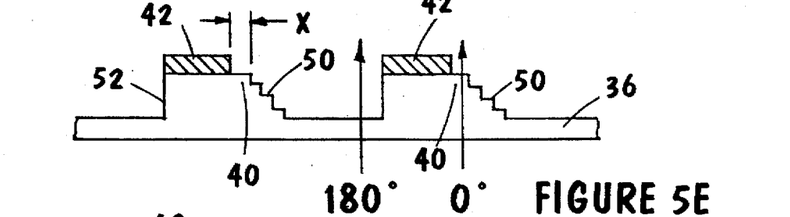
Figure 5F:
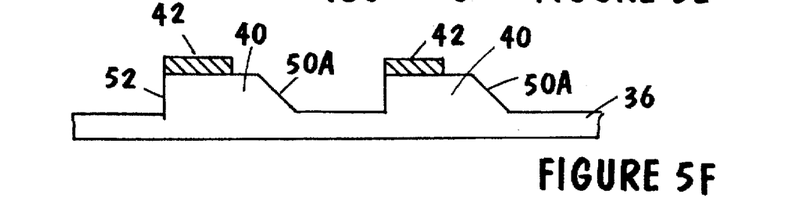

The depth of the etch (d) into the substrate 36 is selected to achieve a phase shift of 180° ($\pi$) relative to the unetched portions of the substrate 36. This etch depth (d) can be determined by the formula:

$$d = i\lambda/2(n-1)$$

where
d=depth of the etch
i=an odd integer
$\lambda$=wavelength of exposure light
n=refractive index of substrate at the exposure wavelength Next, as shown in FIG. 5E, the photoresist 46 is stripped using a suitable wet chemical such as sulfuric acid and hydrogen peroxide or an organic mixture such as ST-22 from ACSI, Milpitas, Calif. This forms phase shifters 40 on the substrate 36 each having a vertical edge 52 and a tapered edge 50 (FIG. 5E) or 50A (FIG. 5F). The phase shifters 40 are self aligned with the select portions 42 of the opaque features 26A, 28A, 30A, 32A (FIG. 4). A width of the select portions 42 determines the width of the feature printed on the wafer.

The tapered edge 50 of each phase shifter 40 is spaced from the edge 45 of the select portion 42 of the opaque features 26A, 28A, 30A, 32A by some distance x. This spacing is required so that as shown in FIG. 5E, phase shifted (e.g., 180°) exposure energy can pass along one side of the select portions 42 of the opaque features and 0° exposure energy can pass along the other side. This produce phase canceling of light diffracted from the edges of the features and permits the features to be printed with a high resolution on a wafer or other target.

Referring back again to FIGS. 4 and 4A, the phase shifters are formed on the select portions 42 of the opaque features 26A, 28A, 30A, 32A to prevent areas of phase conflict. As an example, for the non-linear feature 26A a phase shifter 40 is formed along a lower portion of the feature 26A except in a potential phase conflict area with opaque feature 30A. In this case a phase shifter 40 is formed along edge 34A of non-linear feature 26A to prevent a phase conflict edge 35A of feature 30A.

Such a mask layout lends itself to auto CAD (computer assisted design) layout processes that are used in the art. In particular, the simplicity of the phase shift pattern produced by the present invention makes it suitable for auto-CAD layout process. Up to date CAD programs, such as Cadence sold by Cadence Systems, Mountain View, Calif., allow a programmer to easily write a customized "rule set". The rule set can be used to expand and offset an underlying pattern to generate a layer to be used for writing the pattern that will ultimately be used to create the tapered phase shift areas (e.g., 40—FIG. 4). Using such a CAD program, a minimal number of programming commands can function to "bloat" and "offset" an underlying pattern to a particular side of the primary opaque feature (e.g., 42—FIG. 4A), thus creating a new layer to be written as the phase shifting layer.

In addition, a Design Rule Check (DRC) can be performed to look for areas of phase conflict. The DRC can include a set of programmer generated rules that teach the Auto-CAD program to look for certain line widths and spaces and then "flag" areas which are in conflict with the rule set.

A more detailed check can be performed using aerial image simulation, such as FAIM from Vector Technologies, Princeton, NJ. In general, aerial image simulators are slower and more cumbersome to apply than a DRC rule set. However, some persons skilled in the art believe that aerial image simulation can provide the most robust layout design for wafer fabrication. A combination of phase conflict possibilities can be identified where initially a DRC check is performed to "flag" areas of potential conflict, and then these areas are imported into the aerial image simulation program for more detailed analysis.

By way of example, the auto CAD layout process can include the following "rules":

1. Phase shifters (e.g., 40 FIG. 4) are formed on the "right" of vertical features and on the "bottom" of horizontal features. (Alternately instead of on the "right" and "bottom" substitute "left" and "top".)

2. Any phase transition zone can be placed equidistant between adjacent opaque features. (Where phase transition zone means an area bordering areas of different phases.)

Referring now to FIGS. 6A–6D, the steps involved in forming phase shifters 40A (FIG. 6C) having a tapered edge 60 (or 60A) using an additive process are shown. A transparent substrate 36 with opaque features having select portions 42 is formed as previously described. A phase shift layer 54 is deposited and patterned to cover the select portions 42 of the opaque features. The phase shift layer 54 can be deposited by a conventional process such as evaporation or chemical vapor deposition (CVD). The phase shift layer 54 is formed of a transparent material such as $SiO_2$ having a desired refractive index. In addition, the phase shift layer 54 is formed with a thickness to provide a desired phase shift (e.g., 180°, π). This thickness is equivalent to the etch depth "d" shown in FIG. 5D. The phase shift layer 54 is then covered with a patterned layer of photoresist 56.

Figure 6A:
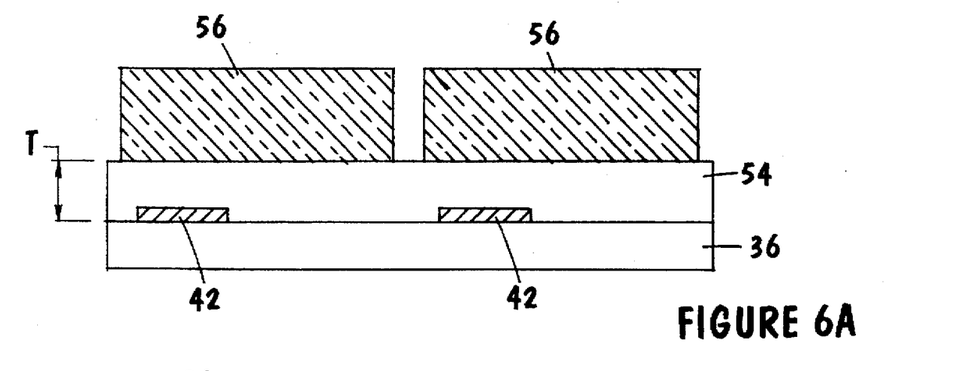
FIGS. 6A–6D are schematic cross sectional views illustrating steps in forming a phase shift photomask in accordance with the invention using an additive process.
Figure 6B:
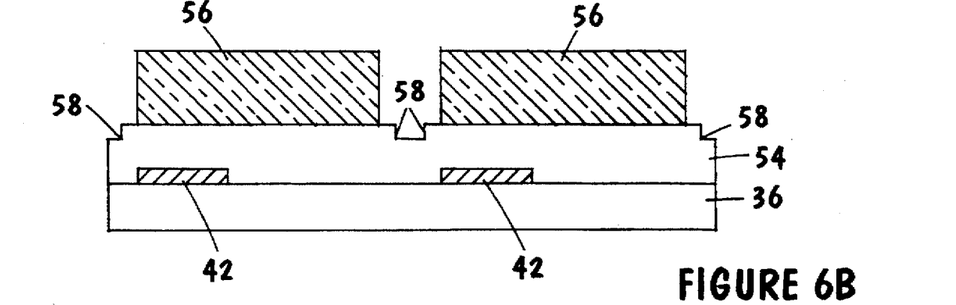

Next, as shown in FIG. 6B, the layer of photoresist 56 is isotropically etched to expose a portion of the surface of the phase shift layer 54 previously covered. The layer of photoresist 56 can be etched using an $O_2$ or $O_2/N_2$ based plasma etch. The exposed surface of the phase shift layer 54 is then isotropically etched using another separate etching step to form a stairstep 58. Depending on the material, the phase shift layer 54 can be etched with a suitable etch species. For example a fluorine based etch species such as $SF_6$, $CF_4$ or $CHF_3$ can be used to etch a phase shift layer formed of $SiO_2$.

Figure 6C:
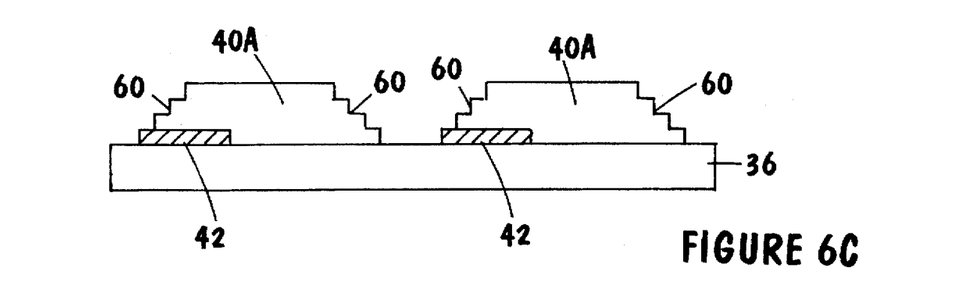

The steps of isotropically etching the photoresist 56 followed by etching the phase shift layer 54 are repeated in discrete etching steps to form a plurality of stairsteps. As shown in FIG. 6C, following stripping of the photoresist 56, this forms phase shifters 40A having tapered edges 60 on each side. In addition, the etch process is controlled such that one edge of the select portion 42 of the opaque feature is left exposed. Thus no phase shifting takes place on one edge of the select portion 42 of the opaque feature but phase shifting does take place on the opposite edge.

Figure 6D:
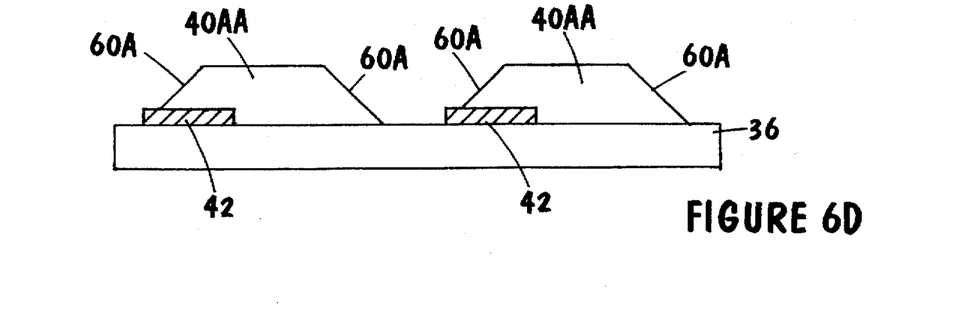

Alternately as shown in FIG. 6D, the etching process for the photoresist 56 and phase shift layer 54 can be performed simultaneously. For example, a combined oxygen/fluorine etch can be used such that the oxygen attacks primarily the photoresist 56 and the fluorine based etching species attacks primarily the phase shifting layer 54. This produces a smooth tapered edge 60A (FIG. 6D) on each side of the phase shifters 40AA.

Figure 7A:
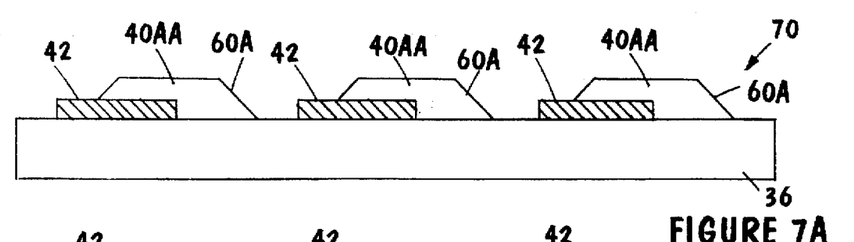
FIGS. 7A–7D are schematic cross sectional views illustrating operational characteristics of phase shift photomasks constructed in accordance with the invention.
Figure 7B:
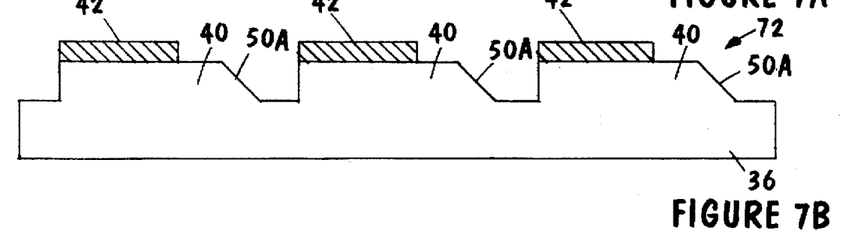

Referring now to FIGS. 7A–7D, operational characteristics of phase shift photomasks formed in accordance with the invention are shown. FIG. 7A is a schematic cross sectional view of a photomask 70 having phase shifters 40AA formed with a tapered edge 60A using an additive process. FIG. 7B is a schematic cross sectional view of a photomask 72 having phase shifters 40 formed with a tapered edge 50A using a subtractive process.

Figures 7C, 7D:
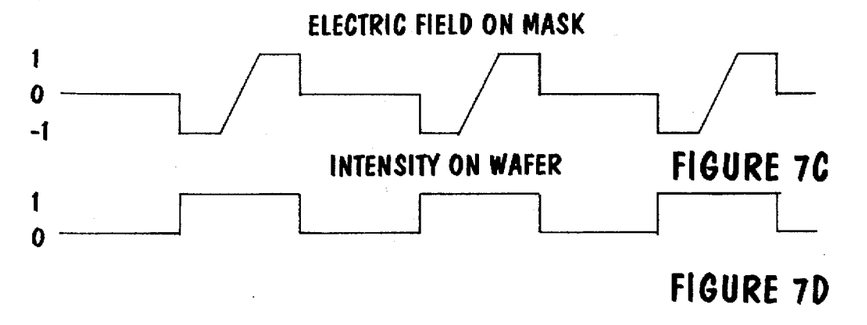

FIG. 7C is a plot of the electric field on the photomasks 70, 72 during a photolithographic process. FIG. 7D is an idealized plot of the intensity at the target. The phase shifters 40AA (FIG. 7A) or 40 (FIG. 7B) cause the electric field to change from −1 intensity to +1 intensity, passing through zero intensity. However, the tapered edges 60A (FIG. 7A) or 50A (FIG. 7B) of the phase shifters 40AA or 40 spread out the transition from −1 intensity to +1 intensity so that a null corresponding to the tapered edge 60A or 50A is not printed on the target. The net result is that the features at the target are defined by the edges of the select portions 42 of the opaque features which are contrast enhanced by phase shifting.

Thus the invention provides an improved method for forming phase shifting photomasks. While the method of the invention has been described with reference to certain preferred embodiments, as will be apparent to those skilled in the art, certain changes and modifications can be made without departing from the scope of the invention as defined by the following claims.

What is claimed is:

1. A method for forming a phase shifting photomask comprising:

forming an opaque layer on a transparent substrate and patterning the opaque layer to form a mask pattern comprising features;

determining areas of phase conflict in the mask pattern; and forming phase shifters along selected edges of features in phase conflict areas of the mask pattern using design rules of a computer aided design program to locate the phase shifters, each said phase shifter including a tapered edge formed with a slope such that the tapered edge does not print on a target in a subsequent lithographic process.

2. The method as recited in claim 1 wherein the design rules locate phase shifters along predetermined selected edges of features in areas of phase conflict.

3. The method as recited in claim 2 wherein the predetermined selected edges comprise upper or lower edges of the features.

4. The method as recited in claim 2 wherein the predetermined selected edges comprise right or left side edges of the features.

5. The method as recited in claim 1 wherein the phase shifters comprise a phase shift layer deposited on the opaque layer and then etched to form the tapered edges.

6. The method as recited in claim 1 wherein the substrate is etched to form the phase shifters and the tapered edges.

7. The method as recited in claim 1 wherein the slope of the tapered edges with respect to a surface of the substrate is less than about 45°.

8. A method for forming a phase shifting photomask comprising:

forming opaque features on a transparent substrate to form a mask pattern;

determining areas of phase conflict in the mask pattern;

forming phase shifters proximate to selected edges of the opaque features in phase conflict areas of the mask pattern using design rules of a computer aided design program to locate the phase shifters, said phase shifters comprising a phase shift layer deposited on the substrate;

each said phase shifter including a tapered edge formed with a slope such that the tapered edge does not print on a target in a subsequent lithographic process.

9. The method as claimed in claim 8 wherein the design rules locate the phase shifters along predetermined edges of features in the areas of phase conflict.

10. The method as recited in claim 9 wherein the tapered edge for each phase shifter is spaced from a predetermined edge of the feature by a distance, such that 180° phase exposure energy can pass along the predetermined edge and 0° phase exposure energy can pass along a second edge.

11. The method as recited in claim 10 wherein the tapered edges comprise a smooth surface.

12. The method as recited in claim 11 wherein the tapered edges are formed by combining a first etching species for etching a resist layer and a second etching species for etching the phase shift layer.

13. The method as recited in claim 10 wherein forming the phase shifters comprises etching the phase shift layer.

14. The method as recited in claim 13 wherein etching the phase shift layer comprises etching with a first etching species followed by etching the with a second etching species.

15. A method for forming a phase shifting photomask comprising:

providing a transparent substrate;

forming a mask pattern on the substrate comprising opaque features;

determining areas of phase conflict in the mask pattern;

etching phase shifters in the substrate in areas of phase conflict using design rules of a computer aided design program to locate the phase shifters, said design rules locating the phase shifters along selected edges of the opaque features;

each said phase shifter including a tapered edge spaced from its selected edge by a distance and extending into the substrate with a slope selected to not print during a lithographic process using the photomask.

16. The method as recited in claim 15 wherein the design rules locate the phase shifters along a right side of vertical features and along a lower side of horizontal features.

17. The method as recited in claim 15 wherein the design rules locate the phase shifters along a left side of vertical features and along an upper side of horizontal features.

18. The method as recited in claim 15 wherein the design rules locate the phase shifters along a right side of vertical features and along an upper side of horizontal features.

19. The method as recited in claim 15 wherein the design rules locate the phase shifters along a left side of vertical features and along a lower side of horizontal features.

20. The method as recited in claim 15 wherein the design rules specify that phase transition zones are placed equidistant between adjacent features.

21. The method as recited in claim 15 wherein etching the phase shifters comprises an isotropic etch.

22. The method as recited in claim 15 wherein the slope of the tapered edge with respect to a surface of the substrate is less than about 45°.

23. A method for forming a phase shifting photomask comprising:

determining a mask pattern having geometrical features including generally vertically oriented features and generally horizontally oriented features;

determining areas of phase conflict in the mask pattern;

forming an opaque layer on a transparent substrate and patterning the opaque layer to form a pattern of opaque features corresponding to the geometrical features; and forming phase shifters for selected edges of the opaque features in the areas of phase conflict, said phase shifters placed on the mask pattern using design rules of a computer aided design program, and with each of said phase shifters including a tapered edge formed with a slope such that the tapered edge does not print on a target in a subsequent lithographic process;

said design rules specifying that the phase shifters are to be formed along first selected edges of the vertically oriented features in areas of phase conflict and along second selected edges of the horizontally oriented features in areas of phase conflict.

24. The method as claimed in claim 23 wherein the design rules specify that phase transition zones are placed equidistant between adjacent opaque features.

25. The method as claimed in claim 23 wherein the design rules specify that the phase shifters are located on a right or left side of vertically oriented features.

26. The method as claimed in claim 23 wherein the design rules flag conflict areas.

27. The method as recited in claim 23 wherein the slope of the tapered edge of each phase shifter with respect to a surface of the substrate is less than about 45°.

* * * * *